United States Patent [19]

Shima et al.

[11] Patent Number: 5,446,080
[45] Date of Patent: Aug. 29, 1995

[54] LIQUID ADHESIVE FOR ELECTRONIC PARTS AND PROCESS FOR FORMING INSULATING ADHESIVE LAYER USING THE SAME

[75] Inventors: Takeshi Shima; Katsuji Nakaba; Masaharu Kobayashi; Yukinori Sakumoto, all of Shizuoka, Japan

[73] Assignee: Tomoegawa Paper Co., Ltd., Tokyo, Japan

[21] Appl. No.: 329,816

[22] Filed: Oct. 27, 1994

[30] Foreign Application Priority Data

Oct. 29, 1993 [JP] Japan ................... 5-292474

[51] Int. Cl.$^6$ ..................... C08K 5/3432; B05D 5/12
[52] U.S. Cl. ................ 524/99; 174/110 SR; 174/137 A; 174/189; 174/196; 427/120; 525/329.3; 525/375
[58] Field of Search ................ 427/120; 174/110 SR; 525/329.3, 375; 524/484, 470, 376, 99

[56] References Cited

U.S. PATENT DOCUMENTS

| | | | |
|---|---|---|---|
| 2,958,672 | 11/1960 | Goldberg | 525/281 |
| 4,918,260 | 4/1990 | Griffith et al. | 427/120 |
| 5,087,681 | 2/1992 | Kinloch et al. | 525/282 |
| 5,364,700 | 11/1994 | Domeier | 525/282 |

Primary Examiner—Veronica P. Hoke
Attorney, Agent, or Firm—Lowe, Price, LeBlanc & Becker

[57] ABSTRACT

A liquid adhesive comprising a dispersion of the following component (b) in a solution of the following component (a) in an organic solvent:
(a) a piperazinylethylaminocarbonyl-containing butadiene-acrylonitrile copolymer
(b) a maleimide compound having at least two maleimide groups.

An insulating pattern or insulating layer is formed by applying the liquid adhesive onto an electronic part by a dispensing or screen printing method, followed by thermally curing.

3 Claims, 4 Drawing Sheets

LIQUID ADHESIVE FOR ELECTRONIC PARTS AND PROCESS FOR FORMING INSULATING ADHESIVE LAYER USING THE SAME

BACKGROUND OF THE INVENTION

1) Field of the Invention

The present invention relates to a liquid adhesive for electronic parts to be used for adhering between parts around a leadframe making up a semiconductor device, e.g., lead pins, semiconductor chip-mounted substrates, heat spreaders, semiconductors themselves, and to a process for forming an insulating adhesive layer using the same.

2) Description of the Related Art

Figure 1A:
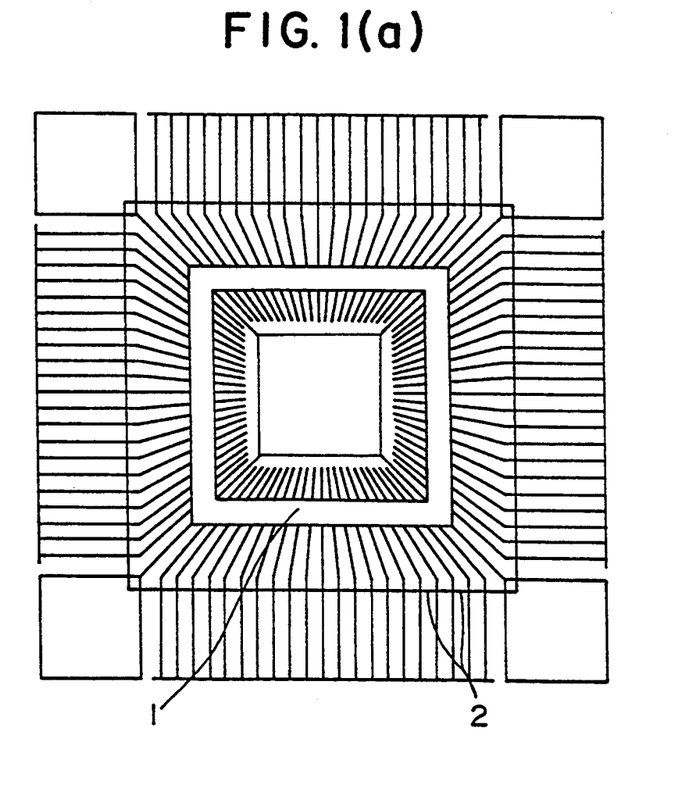
Figure 1B:
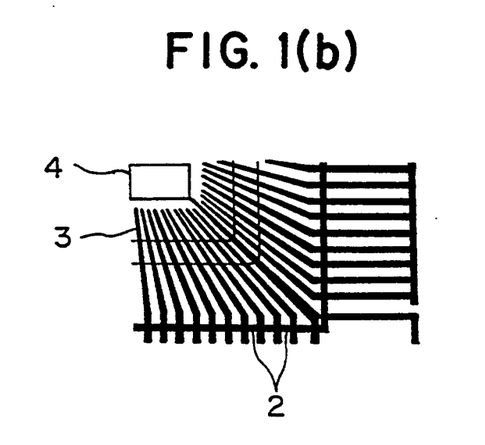

Conventionally, adhesive tapes for innerlead lock of leadframe, TAB tapes, etc., are used as adhesive tapes for use in the interior of resin-sealed type semiconductor devices. For example, the adhesive tapes for innerlead lock of leadframe have been used to fix lead pins of the leadframe in order to increase the yield of production and to enhance the efficiency for producing a leadframe itself and the whole semiconductor assembly stages, as shown in FIG. 1. In general, a leadframe manufacturer a leadframe, and brings to it a semiconductor manufacturer, at which a chip is mounted thereon followed by molding the leadframe with a resin. In FIG. 1, the symbol (a) shows a whole drawing, and (b) shows a partly enlarged view, in which numerical 1 is a position of innerlead lock, 2 is a dam bar, 3 is a lead pin, and 4 is an island portion. For this reason, it has been required for the adhesive tapes for innerlead lock of a leadframe not only to possess general reliability in a level required for semiconductor and enough processability at the time of taping, but also to possess sufficient adhesive strenght immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising a synthetic rubber resin such as plyacrylonitrile, polyacrylate or acrylonitrile-butadiene copolymer solely, or modified with any other resin or blended with any other resin to come into a B-stage.

In recent years, in the interior of the semiconductor device, the package structure has become complicated due to the increased number of pins and the need to secure the radiating ability and, thus, the organic materials used therein have had severe requirements in terms of electronic and physical properties as well as handling characteristics.

The adhesive tapes hitherto used for electronic parts in which a base film is necessarily required have had problems respective to fixation of lead pins and other application.

Figure 2:
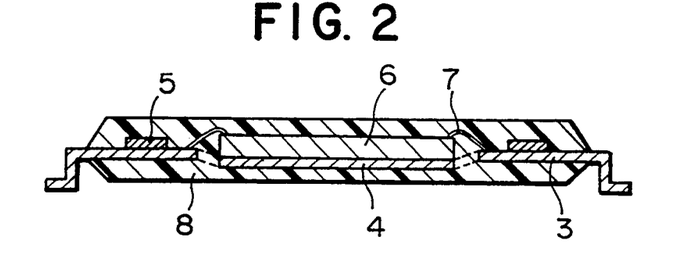
FIG. 2 is a cross-sectional view showing one example of a resin-molded semiconductor device.

For example, in the case where the conventional adhesive is applied onto the base film is used in the fixation of lead pins in the conventionally developed resin-molded type semiconductor device (semiconductor package) as shown in FIG. 2, the heat resistance and electronic reliability are insufficient in some cases. In FIG. 2, lead pins 3 are locked by means of a locking tape 5, and connected with a semiconductor chip onto an island portion 4 via a bonding wire 7, which is molded with a molding resin 8. Also, in the case where a polyimide tape or a similar tape is applied, the conditions of temperature and pressure for taping and conditions for curing are severe so that the metal materials, such as leadframes, are damaged. Moreover, the conventional type of tape has been required to have a suitable area for applying a punch die and for ensuring a high level of accuracy, but accompanying the increase in the number of pins and down sizing, the necessary area has not been able to be ensured. For this reason, it has been required to develop a system and material which can be applied to an area narrower than the conventional area with a high level of accuracy and which is capable of innerlead lock.

Furthermore, dam bar 2 as shown in FIG. 1 is provided for the purpose of preventing the resin from being protruded during the course of transfer molding, and it is required to be cut off and removed thereafter. Moreover, accompanying the increase in the number of pins, the outer lead pitch become narrower, making it difficult to remove the metal dam bars themselves. For this reason, efforts have been made to use a conventional adhesive tape for electronic parts so as to be substituted for the metal dam bars, but due to the use of the polyimide based film, defects have occurred such as deformation of pins during molding.

Moreover, in the case of multi-layered leadframes, e.g., in the case of adhering a heat sink and leadframe while maintaining the insulation between them, a triple-layered tape in which a polyimide film is placed as a central layer, and an adhesive having high electronic reliability and little gas generation is adhered on the both sides has been used. Due to the complicated stages, however, it has been difficult to save cost. For this reason, it has been required to develop a liquid adhesive which can be used for adhering a heat sink and leadframe.

In addition, a double faced adhesive tape for electronic parts has been used for adhering lead pins and the body of a semiconductor chip such as in the case of an LOC structure and a COL structure, but the tape has problems in terms of the application of pressure and temperature onto the semiconductor chip during the course of taping and difficulty in saving cost.

Various adhesive tapes, adhesives, and organic insulating materials for use in electronic parts all have problems more or less.

In order to solve these problems, it has been, therefore, desired to develop a liquid adhesive for electronic parts which can be adhered and cured at a relatively low temperature, and possesses enough heat resistance, reliability, and processability.

SUMMARY OF THE INVENTION

The object of the present invention is, therefore, to provide a liquid adhesive for electronic parts which can be adhered and cured at a relatively low temperature, and possesses enough heat resistance and reliability, etc., and to provide a process for forming an insulating adhesive layer using the same.

The liquid adhesive for electronic parts of the present invention comprises a dispersion obtained by dispersing the following component (b) in a solution of the following component (a) in an organic solvent, wherein the ratio of the component (b) to the component (a) is in a range of 10 to 900 parts by weight based on 100 parts by weight of component (a):

(a) a piperazinylethylaminocarbonyl-containing butadieneacrylonitrile copolymer having a weight average molecular weight of 1,000–200,000, an acrylonitrile content of 5–50% by weight, and an amino equivalent of 500–10,000, represented by the following formula (I-1) or (I-2):

(I-1)

(I-2)

wherein, k, m, and n are molar ratios and taking n as 1, k is a number of 3–175, and m is a number of 0.3 to 93 in an organic solvent;

(b) a maleimide compound having at least two maleimide groups selected from the compounds represented by the following formulae (II-1) to (II-6):

(II-1)

(II-2)

(II-3)

(II-4)

wherein p represents an integer of from 0 to 7

(II-5)

(II-6)

wherein $R = H$ or $CH_3$, and $r = 1–5$.

BRIEF DESCRIPTION OF DRAWINGS

FIG. 1 is a schematic view showing the construction of a leadframe, wherein FIG. 1 (a) is a whole view and FIG. 1 (b) is a partially enlarged view;

FIG. 9 is a view explaining the production of a resin dam bar using a liquid adhesive, wherein FIG. 9 (a) is a cross-sectional view immediately after the application of the adhesive, and FIG. 9 (b) is a cross-sectional view after pressing.

DETAILED DESCRIPTION OF PREFERRED EMBODIMENTS

The present invention will now be described in detail.

The piperazinylethylaminocarbonyl-containing butadiene-acrylonitrile copolymers having a weight average molecular weight of 1,000–200,000, an acrylonitrile content of 5–50% by weight, and an amino equivalent of 500–10,000, represented by the above-enumerated formula (I-1) or (I-2) to be used as component (a) may be synthesized in various manners or may be available as commercial products. For example, copolymers represented by formula (I-1) are synthesized by the amidation of butadiene-acrylonitrile copolymers having carboxyl groups at both terminals with N-aminoethylpiperazine or, alternatively may be appropriately selected from among commercial products to be used. Copolymers represented by formula (1-2) can be synthesized by the condensation of carboxyl-containing butadiene-acrylonitrile copolymers represented by the following formula (III) with N-aminoethylpiperazine in the presence of a phosphite.

wherein k, m, and n have the same meanings as described above.

The piperazinylethylaminocarbonyl-containing butadiene-acrylonitrile copolymers which can be used in the present invention are those having a weight average molecular weight of 1,000–200,000, preferably 20,000 to 150,000, an acrylonitrile content of 5–50% by weight, preferably 10–40% by weight, and an amino equivalent of 500–10,000, preferably 1,000–8,000.

Instead of the piperazinylethylaminocarbonyl-containing butadiene-acrylonitrile copolymers represented by the above-enumerated formula (I-1) or (I-2), it is also possible to use copolymers represented by the following formula (I-3).

In the present invention, the compounds having at least two maleimide groups of component (b) are incorporated in an amount in the range of 10 to 900 parts by weight, preferably 20 to 500 parts by weight, based on 100 parts by weight of the piperazinylethylaminocarbonyl-containing butadiene-acrylonitrile copolymer of component (a). If the amount of component (b) is less than 10 parts by weight, the heat resistance of the adhesive after the application and curing, especially Tg, and Young's modulus, is remarkably degraded, leading to an adhesive unsuitable for the intended purpose. Conversely, if it exceeds 900 parts by weight, the adhesive itself becomes brittle when cured into the B stage, resulting in decreased processability.

In the present invention, the mixing of component (a) with (b) is carried out in an organic solvent which dissolves component (a) but does not dissolve component (b). The organic solvents which can be used include benzene, toluene, xylenes, ethylbenzene, butylbenzene, cumene, mesitylene, pcymene, diethylbenzene, pentylbenzene, dipentylbenzene, dodecylbenzene, 2-methoxyethanol, 2-ethoxyethanol, 2-butoxyethanol, 1,4-dioxane, chlorobenzene, dichlorobenzene, carbon tetrachloride, nitrobenzene, methyl formate, ethyl formate, propyl formate, butyl formate, isobutyl formate, pentyl formate, methyl acetate, ethyl acetate, propyl acetate, isopropyl acetate, butyl acetate, isobutyl acetate, sec-butyl acetate, pentyl acetate, isopentyl acetate, benzyl acetate, methyl propionate, ethyl propionate, butyl propionate, isopentyl propionate, trichloroethylene, trichloroethane, pyridine, etc. They should be appropriately selected to be used so as to dissolve component (a) and not to dissolve component (b).

In order to accelerate the addition reaction between components (a) and (b) and the addition reaction between two or more of components (b), to the liquid adhesive of the present invention may optionally be added diazabicyclooctane or organic peroxides, such as-or methyl ethyl ketone peroxide, cyclohexane peroxide, 3,3,5-trimethylcyclohexanone peroxide, methylcyclohexanone peroxide, methylacetoacetate peroxide, acetylacetone peroxide, 1,1-bis(t-butylperoxy)-3,3,5-trimethylcyclohexane, 1,1-bis(t-butylperoxy)cyclohexane, 2,2-bis(t-butylperoxy)octane, n-butyl-4,4-bis(t-butylperoxy)valerate, 2,2-bis(t-butylperoxy)butane, t-butyl hydroperoxide, cumene hydroperoxide, di-isopropylbenzene hydroperoxide, p-mentane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, α, α'-bis(t-butylperoxy-m-isopropyl)benzene, 2,5-dimethyl-2,5-di-(t-butylperoxy)hexane, acetyl peroxide, 2,5-dimethyl-2,5-di-(t-butylperoxy)hexyne, acetyl peroxide, isobutyl peroxide, octanoyl peroxide, decanoyl peroxide, benzoyl peroxide, lauroyl peroxide, 3,5,5-trimethylhexanoyl peroxide, succinic acid peroxide, 2,4-dichlorobenzoyl peroxide, m-toluoyl peroxide, di-isopropylperoxy dicarbonate, di-2-ethylhexylperoxy dicarbonate, di-n-propylperoxy dicarbonate, bis-(4-t-butylcyclohexyl)peroxy dicarbonate, di-myristylperoxy dicarbonate, di-2-ethoxyethylperoxy dicarbonate, dimethoxyisopropylperoxy dicarbonate, di(3-methyl-3-methoxybutyl)peroxy dicarbonate, di-allylperoxy dicarbonate, t-butylperoxy acetate, t-butylperoxy isobutyrate, t-butylperoxy pivalate, t-butylperoxy neodecanate, cumylperoxy neododecanate, t-butylperoxy 2-ethylhexanate, t-butylperoxy-3,5,5-trimethylhexanate, t-butylperoxy laurate, t-butylperoxy dibenzoate, di-t-butylperoxy isophthalate, 2,5-dimethyl-2,5-di(benzoylperoxy)hexane, t-butylperoxy maleic acid, t-butylperoxy isopropylcarbonate, cumylperoxy octate, t-hexylperoxy neodecanate, t-hexylperoxy pivalate, t-butylperoxy neohexanate, t-hexylperoxy neohexanate, cumylperoxy neohexanate, acetylcyclohexylsulfonyl peroxide, and t-butylperoxy allylcarbonate; and imidazoles such as 1,2-dimethylimidazole, 1-methyl-2-ethylimidazole, 2-methylimidazole, 2-ethyl-4-methylimidazole, 2-undecylimidazole, 2-heptadecylimidazole, 2-phenylimidazole, 1-benzyl-2-methylimidazole, 1-benzyl-2-phenylimidazole, 1-benzyl-2-phenylimidazole trimellitate, 1-benzyl-2-ethylimidazole, 1-benzyl-2-ethyl-5-methylimidazole, 2-ethylimidazole, 2-isopropylimidazole, 2-phenyl-4-benzylimidazole, 1-cyanoethyl-2-methylimidazole, 1-cyanoethyl-2-ethyl-4-methylimidazole, 1-cyanoethyl-2-undecylimidazole, 1-cyanoethyl-2-isopropylimidazole, 1-cyanoethyl-2-phenylimidazole, 1-cyanoethyl-2-methylimidazolium trimellitate, 1-cyanoethyl-2-ethyl-4-methylimidazolium trimellitate, 1-cyanoethyl-2phenylimidazolium trimellitate, 2,4-diamino-6-[2'-methylimidazolyl-(1)']-ethyl-S-triazine, 2,4-diamino-6-[2'-ethyl-4-methylimidazolyl-(1)']-ethyl-S-triazine, 2,4-diamino-6-[2'-undecylimidazolyl-(1)']-ethyl-S-triazine, isocyanuric acid adduct of 2-methylimidazolium, isocyanuric acid adduct of 2-phenylimidazolium, isocyanuric acid adduct of 2,4-diamino-6-[2'-methylimidazole-(1)']-ethyl-S-triazine, 2-phenyl-4,5-dihydroxymethylimidazole, 2-phenyl-4-methyl-5-hydroxymethylimidazole, 2-phenyl-4-benzyl-5-hydroxymethylimidazole, 4,4'-methylene-bis-(2- ethyl-5-methylimidazole), 1-aminoethyl-2-methylimidazole, 1-cyanoethyl-2-phenyl-4,5-di(cyanoethyoxymethyl)imidazole, 1-dodecyl-2-methyl-3-benzylimidazolium chloride, 4,4'-methylene-bis-(2-ethyl-5-methyl-imidazole), 2-methylimidazole-benzotriazole adduct, 1,2-dimethylimidazolebenzotriazole adduct, 1,2-aminoethyl-2-ethylimidazole, 1-(cyanoethylaminoethyl)-2-methylimidazole, N,N'-[2-methylimidazolyl-(1)-ethyl]-adipoyldiamide, N,N'-bis-(2-methylimidazolyl-1-ethyl)urea, N-[2-methylimidazolyl-(1)-ethyl]-urea, N,N'-[2-methylimidazolyl-1-ethyl]dodecanedioyldiamide, N,N'-[2-methylimidazolyl-(1)-ethyl]eicosanedioyldiamide, 1-benzyl-2-phenylimidazole hydrochloride, and 1-cyanoethyl-2-phenyl-4,5-di(cyanoethoxylmethyl)imidazole; and reaction accelerators such as triphenyl phosphine.

Furthermore, in order to maintain the shape of the above components during the course of molding and to enhance the applicability of the liquid adhesive, a globular, flake-like, or amorphous filler having a particle size of not more than 20 $\mu$m can be incorporated. The fillers which can be used are silica, quartz powder, alumina, calcium carbonate, magnesium oxide, diamond powder, mica, fluorinated resin powder, zircon powder, etc. These fillers may be used alone or as a mixture of two or more of them. The filler content is set to be in the range of 2 to 60% by weight, preferably 5 to 40% by weight of the total solid content. If the content is lower than 2% by weight, no enhancement of the capability to maintain the shape and no improvement of applicability can be brought about and, conversely, if it exceeds 60% by weight, the adhesive strength and strength after curing are decreased.

The liquid adhesive of the present invention can be adhered and cured at a relatively low temperature, and has good heat resistance, reliability and processability. Since it can be applied to a wide variety of electronic parts by means of dispenser or screen printer, adhered, and cured to form an adhered pattern or an insulating layer, the problems possessed by the conventional adhesive tapes and liquid adhesives for electronic parts can be solved.

Furthermore, the liquid adhesive of the present invention is particularly suitable for adhering between parts around a leadframe making up a semiconductor device, and it can be used in the case where a complicated construction is made. Consequently, the liquid adhesive of the present invention contributes to save cost.

The use of the liquid adhesive for electronic parts of the present invention in various processes will now be described.

When the liquid adhesive for electronic parts of the present invention is used to make an insulating layer such as a resin pattern, it is preferable to carry out the processing according to the following stages:

First, in the formulation stage, component (a) is dissolved in an organic solvent to prepare a solution into which powdery component (b) is incorporated. Thereafter, in the dispersing stage, the mixture is kneaded by means of a ball mill or a three-roll to carry out the dispersing. In the application stage, the liquid adhesive obtained by the dispersing and kneading is applied to a metallic body intended to be coated, e.g., an electronic part such as a leadframe by means of a dispenser or a screen printer in the state of a predetermined pattern. Thereafter, the liquid adhesive is then desolvated or converted into a prepreg in the drying stage by heating and, subsequently, in the pressing stage, the liquid adhesive is melted and extruded into a predetermined thickness, thereby obtaining a prescribed shape. Thereafter, the liquid adhesive is thermally cured in the curing stage to obtain an intended resin pattern or an insulating layer.

In the above stages, the formulation stage means a stage wherein the main agents, curing agent, elastomer, filler, solvent, and other additives are mixed, and the order of the addition and mixing method are not restricted.

In the dispersing stage, the composition formulated in the former stage is to become uniform. As for the compound having at least two meleimide groups, that having a particle size of 0.01 $\mu$m is present in a ratio of at least 50% by weight, preferably at least 80% by weight, and the upper limit of the particle size may be 500 $\mu$m, preferably 100 $\mu$m. As the dispersing means, a three-roll, ball mill and homogenizer are proven to be preferable, but the dispersing method is not particularly restricted as long as the above object can be achieved.

Figure 6:
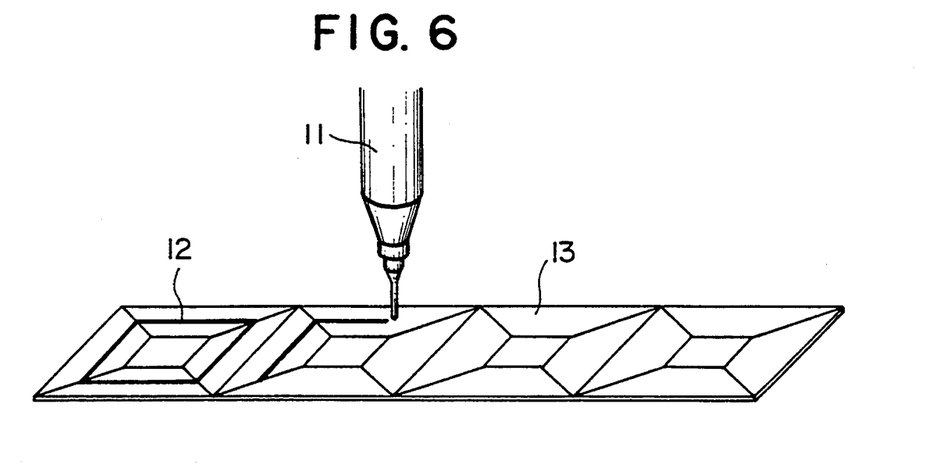
FIG. 6 is a view explaining a dispensing method.

A dispensing method or screen printing method is applicable to the application stage of the liquid adhesive of the present invention. FIG. 6 shows an outline of the dispensing method, and FIG. 7 shows an outline of the screen printing method.

In the case of using the dispensing method, as shown in FIG. 6, the liquid adhesive described above is charged in a syringe, which is put into a dispenser 11 equipped with an XY robot. Subsequently, the substrate to which a liquid adhesive pattern is applied, e.g., a leadframe 13, etc. is set at a given position, and the liquid adhesive is discharged while driving the dispensed portion or the substrate using an application program, whereby an intended pattern 12 is formed.

Figure 7:
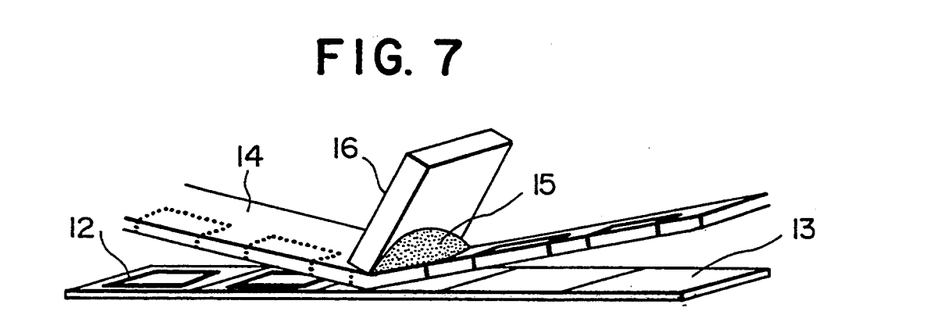
FIG. 7 is a view explaining a screen printing method.

In the case of using the screen printing method, as shown in FIG. 7, an adhesive 15 is placed on a screen printing board 14 on which a prescribed pattern is provided, and an electronic part to which a pattern is applied, e.g., leadframe 13, is placed, and then moved on the screen printing board while pushing squeegee 16 against the body intended to be applied.

The drying stage is carried out if a solvent is contained in the adhesive so as to remove the solvent to some extent. In the case where no solvent is contained, the drying stage can be carried out for the purpose of obtaining a prepreg state. In the case where the solvent is somewhat volatilized, e.g., due to being left standing after the application of the adhesive or in the case where a prepreg is obtained due to being left standing, the drying stage can be omitted. The method of drying may be carried out in any manner, such as hot-air drying or infrared heating, as long as the object is achieved.

The pressing stage is a stage which is carried out in order that the liquid adhesive applied in the form of pattern by dispensing or screen printing is pressed with heating to regulate it in a prescribed shape. For example, the pressing stage is required in the case where the substrate has unevenness or gaps and a resin pattern is completely embedded, as in a leadframe.

The curing stage is a stage which is carried out for the purpose of obtaining a thermally cured resin pattern by heating a liquid adhesive pattern whose shape has been regulated in the above stage.

As for the heating method, heating on a heat block or in an oven under an atmosphere of air or nitrogen, heating by infrared rays or applying heating methods in combination thereof is possible, but any other method is possible as long as the resin is heated.

Furthermore, several embodiments of applying the liquid adhesive of the present invention to a wide variety of electronic parts will be explained by referring to examples.

The first embodiment will be described where the liquid adhesive of the present invention is used to lock lead pins.

The liquid adhesive of the present invention is applied in a pattern form onto lead pins by the dispensing method or screen printing method and, if required, the pressing stage is carried out, and the adhesive is then thermally cured to form a resin pattern for locking lead pins.

Specifically, in the case of applying the dispensing method, different patterns can be dealt only by changing the needle or program of the dispensing device, and in the case of using the screen printing method, different patterns can be dealt only by exchanging the printing pattern, indicating that the provision of a mold which is conventionally required is unnecessary. Also, since it is possible to be applied on a narrow area, the lock of lead pins can easily be carried out even in the case of a leadframe having a shape which is conventionally impossible to be locked.

By using the liquid adhesive of the present invention, the problems caused according to the increase in the number of pins and miniaturization in the case of using the tape type adhesive can be solved:

1) Since a mold is required for each pattern, high cost is required especially in the case of the production of many products in a small amount.

2) Considering the fact that approximately 1 mm of tape width is required in taping and considering the accuracy of tape, in the cases of some miniature packages, no package area can be ensured.

3) Because a polyimide base film is required, the cost increases accordingly.

4) Because a polyimide base film is highly hygroscopic, there is a possibility of package-cracking in the case where moisture is absorbed from an external cause.

The second embodiment will be described where the liquid adhesive of the present invention is used to produce a dam bar resin pattern.

Figure 9A:
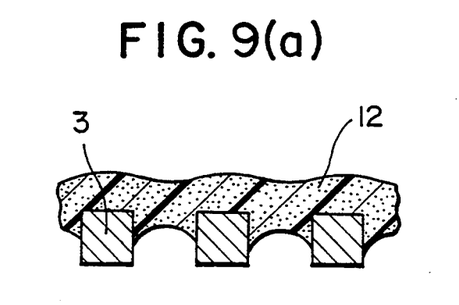
Figure 9B:
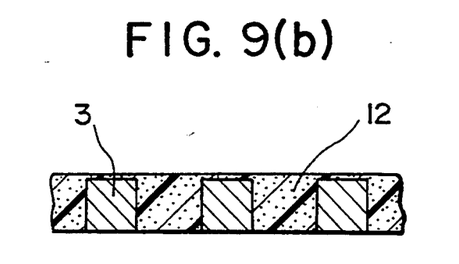

In the case where the liquid adhesive of the present invention is to be applied onto a dam bar portion by the above-enumerated application stage, the liquid adhesive is also somewhat penetrated between lead pins to create a sectional shape as in FIG. 9 (a). Thereafter, via the above-mentioned pressing stage and the curing stage, the liquid adhesive is completely charged in-between lead pins as shown in FIG. 9 (b), making it possible to act as the dam bar.

The resin thickness at this time is approximately equal to the thickness of the leadframe, which means that there is no possibility of applying excessive pressure to the lead pins when molded.

Via the curing stage, the curing of the liquid adhesive of the present invention proceeds to become a resin having a relatively high Young's modulus, thereby imparting the function as the dam bar.

Using the liquid adhesive of the present invention, it is not necessary to remove the dam bar after transfermolding, while retaining the portion of dam bar 2 during the production of the leadframe, as shown in FIG. 1, as is the conventional case, leading to saved labor and cost. Furthermore, the following problems in the case of using an insulating tape for electronic parts in which a polyimide film is used as a base film, and which has several results in terms of the lock of pins and insulating properties can be solved:

1) Since the adhesive tends not to be perfectly charged in between pins, the function as the dam bar cannot be achieved in some cases.

2) Since the Young's modulus of a cured adhesive is low, a cured adhesive is extruded by means of pressure during molding and, thus, no dam bar function can be achieved in some cases.

3) Due to the existence of the base film, the mold pressurizes the base film, and lead pins are sometimes bent by such an influence.

Figure 3:
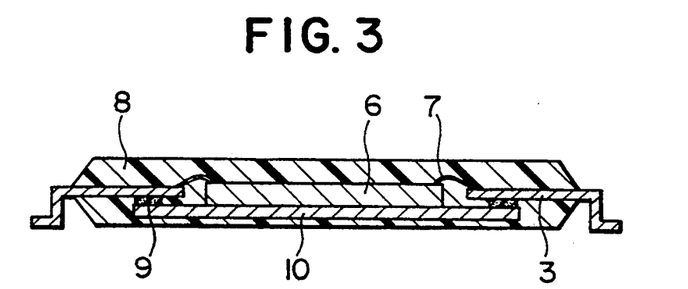
FIG. 3 is a cross-sectional view showing another example of a resin-molded semiconductor device.

The third embodiment will be described where the liquid adhesive of the present invention is used in a multi-layered leadframe as shown in FIG. 3. In FIG. 3, a heat sink 10 having a semiconductor chip 6 provided thereon and lead pins 3 are adhered via an insulating adhesive layer 9, and the semiconductor chip and lead pins are connected via a bonding wire, and they are molded with a molding resin.

As shown in FIG. 3, in the case of adhering the heat sink and lead pins while maintaining the insulation between them, the liquid adhesive of the present invention is applied in a prescribed pattern to either, or both, of the heat sink and lead pins by the dispensing method or the screen printing method, and then the heat sink and the leadframe are simply placed, after which the liquid adhesive is thermally cured. This makes it possible to cure the liquid adhesive while maintaining the insulating properties.

Figure 4:
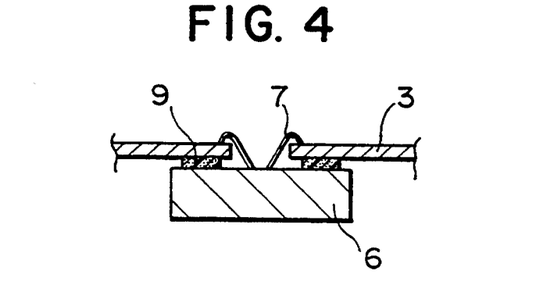
FIG. 4 is a schematic view showing an LOC structure.
Figure 5:
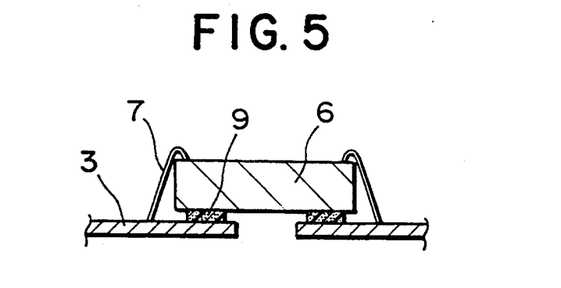
FIG. 5 is a schematic view shown a COL structure.

The fourth embodiment in which the liquid adhesive of the present invention is used for an LOC structure, as shown in FIG. 4 or a COL structure as shown in FIG. 5, will be described. In FIGS. 4 and 5, a semiconductor chip 6 and lead pins 3 are adhered via an insulating adhesive layer 9, and the semiconductor chip and lead pins are connected via bonding wire 7.

In the case where the lead pins and the semiconductor chip are adhered with the liquid adhesive of the present invention, after a prescribed adhesive pattern is formed by the dispensing method or the screen printing method similar to the above embodiments, they can be adhered while maintaining the insulation between them. In this case, the problems caused by the use of the double-faced adhesive tape, such as by the application of pressure, temperature and impact upon the chip can be avoided.

As described above, in the case of using the liquid adhesive of the present invention, a resin pattern or an insulating layer can be formed by applying the liquid adhesive to various electronic parts by the dispensing method or the screen printing method, and curing the adhesive.

EXAMPLES

Example 1

Into 200 parts of toluene were dissolved 50 parts by weight of an acrylonitrile-butadiene copolymer represented by the above-enumerated formula (I-1) (Hycar ATBN, produced by Ube Industries, Ltd.) having piperazinylethylaminocarbonyl groups at both terminals ($m=83.5$, $n=16.5$, weight average molecular weight: 3,600, acrylonitrile content: 16.5% by weight, amino group equivalent: 900), and 50 parts of by weight of a compound represented by the above-enumerated formula (II-1), 1 part by weight of benzoyl peroxide, and 20 parts by weight of a globular alumina having an average particle size of 0.25 μm were mixed with and dispersed in the dissolved solution to obtain a liquid adhesive.

Example 2

A liquid adhesive was produced in the same manner as in Example 1, except that the amount of the acrylonitrile-butadiene copolymer having piperazinylethylaminocarbonyl groups at both terminals was changed from 50 parts by weight to 80 parts by weight, and the amount of the compound of the formula (II-1) was changed from 50 parts by weight to 20 parts by weight.

Example 3

A liquid adhesive was produced in the same manner as in Example 1, except that the amount of the acrylonitrile-butadiene copolymer having piperazinylethylaminocarbonyl groups at both terminals was changed from 50 parts by weight to 20 parts by weight, and the amount of the compound of the formula (II-1) was changed from 50 parts by weight to 80 parts by weight.

Example 4

A liquid adhesive was produced in the same manner as in Example 1, except that a compound represented by formula (I-2) having a weight average molecular weight of 50,000, an acrylonitrile content of 25% by weight, and an amino equivalent of 5,000 was used instead of the acrylonitrile-butadiene copolymer having piperazinylethylaminocarbonyl groups at both terminals, and the amount of toluene was changed from 200 parts to 400 parts.

Example 5

A liquid adhesive was produced in the same manner as in Example 1, except that a compound represented by formula (II-4) was used instead of the compound represented by formula (II-1).

Example 6

A liquid adhesive was produced in the same manner as in Example 1, except that a type of compound represented by formula (II-6) (2000 MP, produced by MITSUBISHI PETROCHEMICAL COMPANY, LRD.) was used instead of the compound represented by formula (II-1).

Example 7

A liquid adhesive was produced in the same manner as in Example 1, except that 2-ethyl-4-methylimidazole was used instead of benzoyl peroxide.

Comparative Example 1

A liquid adhesive was obtained by adding 1 part by weight of benzoyl peroxide to 100 parts by weight of epoxy acrylate (R-551, produced by NIPPON KAYAKU CO.LTD.).

Comparative Example 2

A liquid adhesive was obtained by adding 20 parts by weight of a globular alumina used in Example 1 to 100 parts by weight of nylon-epoxy resin (Toresine FS-410, produced by Teikoku Kagaku Sangyo K.K.) (solid content: 20%; solvent isopropyl alcohol:methyl ethyl ketone=2:1).

Comparative Example 3

A liquid adhesive was obtained by adding to 20 parts by weight of alumina (UA-5105, produced by SHOWA DENKO K.K.) to 500 parts by weight of a 20% strength solution of polyimide varnish (Lark TPI, produced by MITSUI TOATSU CHEMICALS INC.) in N-methylpyrrolidone, based on 100 parts by weight of the solid content of the above solution.

(ASSEMBLING OF SEMICONDUCTOR PACKAGE)

The leadframe as shown in FIG. 1 was assembled according to the following procedures.
(a) Production of Leadframe
Use of Liquid Adhesives of Examples 1 to 5 and Comparative Examples 1 and 3

Using an XY robot dispenser, a liquid adhesive was applied to the position shown in FIG. 1 (a) to form an adhesive pattern, and the adhesive was dried and cured under the conditions shown in Table 1.
Use of Liquid Adhesives of Examples 6 and 7 and Comparative Example 2

Using a screen printer, a liquid adhesive was applied to the position shown in FIG. 1 (a) to form an adhesive pattern, and the adhesive was dried and cured under the conditions shown in Table 1.

TABLE 1

|  | Application of Adhesive | Drying of Adhesive | Curing of Adhesive ($N_2$ atmosphere) |
| --- | --- | --- | --- |
| Ex. 1–5 | Dispensing | 80° C./30 sec. | 200° C./1 hr. |
| Ex. 6–7 | Screen Printing | 80° C./30 sec. | 200° C./1 hr. |
| Comp. 1 | Dispensing | 80° C./30 sec. | 200° C./1 hr. |
| Comp. 2 | Screen Printing | 80° C./30 sec. | 150° C./3 hrs. |
| Comp. 3 | Dispensing | 150° C./2 hrs. | 250° C./1 hr. |

Thereafter, the produced leadframe was used to assemble a package according to the following procedures. The reason why the conditions of adhesion under pressing and the conditions of curing were different when assembling the package is that the characteristics of the adhesives are different from each other. Here, optimum conditions for each adhesive were selected, and the adhesive was cured based on such conditions.
(b) Die Bonding A semiconductor chip was adhered to a plane portion with a silver paste for die bonding, which was then cured at 150° for 2 hours.
(c) Wire Bonding Using a wire bonder, a wire pad on the semiconductor chip and a silver plated portion at the end of the inner lead were connected with a gold wire.
(d) Molding Using an epoxy molding compound, transfer molding was carried out.
(e) Finishing Stage Via the stages of forming, dam cutting, solder plating on the outer leads, etc., the packaging was finished.
(Evaluation of Adhesive)

In the production of the leadframe, the following evaluations were carried out.
1. INK SUITABILITY Processability of the adhesive such as applicability and storability was evaluated.

2. OXIDIZATION OF LEADFRAME

The evaluation of whether or not the surface of leadframes was oxidized during the course of the application, pressing, or curing of the adhesive was carried out.

3. ADHESIVE STRENGTH

The evaluations of whether or not the adhesive has a sufficient adhesive strength and of whether or not the adhesive strength varied were carried out. A 90° peel strength was determined at normal temperature.

4. WIRE BONDABILITY

In the assembling of the package, the wire bondability onto the leadframe at the wire bonding and the adhesive strength were confirmed. These are considered to be an index of heat resistance of the resin.

5. ELECTRICAL RELIABILITY TEST OF THE SEMICONDUCTOR PACKAGE

5 V of bias electronic power was applied to the lead pin having 50 $\mu$m of space between pins at 156° at 85% of relative humidity, and at 4 atmospheres for a time until it was determined that shorting had been taken place.

onto the pattern for 30 minutes to carry out drying. As for the pressing, a presser having Teflon coated on the face with which the adhesive pattern is in contact was used to press the pattern at 150° C. for 30 minutes, thereby embedding the pattern into the gaps between lead pins, while molding the package into a shape where no unevenness was present on the upper surface of the pattern. Furthermore, in order to thermally cure the adhesive pattern, the adhesive pattern was heated in an infrared-heating furnace whose interior had been replaced by a nitrogen atmosphere at 250° C. for 5 minutes to obtain an intended dam bar-equipped leadframe.

Example 9

A leadframe provided with a resin-made dam bar was obtained in the same manner as in Example 8, except that the liquid adhesive obtained from Example 2 was used, and the adhesive was applied by the screen printing. Comparative Example 4

A leadframe provided with a resin-made dam bar was obtained in the same manner as in Example 8, except

TABLE 2

| | Ink Suitability | Oxidization of Leadframe | Adhesive Strength | Wire of Bondability | Electrical Reliability | Total Evaluation |
|---|---|---|---|---|---|---|
| Example 1 | Good | None | 25–40 | 0/832 | Good | Good |
| Example 2 | Good | None | 25–40 | 0/832 | Good | Good |
| Example 3 | Good | None | 25–40 | 0/832 | Good | Good |
| Example 4 | Good | None | 25–40 | 0/832 | Good | Good |
| Example 5 | Good | None | 25–40 | 0/832 | Good | Good |
| Example 6 | Good | None | 25–40 | 0/832 | Good | Good |
| Example 7 | Good | None | 25–40 | 0/832 | Good | Good |
| Comp. Example 1 | Good | None | 2–4 | 0/832 | Bad[#3] | Bad |
| Comp. Example 2 | Good | None | 10–40 | 125/832[#2] | Bad[#3] | Bad |
| Comp. Example 3 | Good | Observed[#1] | 2–4 | 0/83 | Good | Bad |

[#1] Since the drying temperature was too high, the oxidation of the surface of the leadframe started.
[#2] The gold wire was wired but lacked sufficient strength.
[#3] The shorting was confirmed within 336 hours.

As is clear from Table 2, in the cases of the adhesive pastes using the liquid adhesives of the present invention, the package of a semiconductor could be manufactured in a good manner. In contrast, in the cases of the adhesives according to the Comparative Examples, problems in that oxidation of leadframe took place, that the wire bonding of the gold wire could not be carried out, and that there was no electrical reliability were caused.

(EXAMPLES AND COMPARATIVE EXAMPLES FOR APPLICATION WITH OTHER ELECTRIC PARTS)

Example 8

Figure 8:
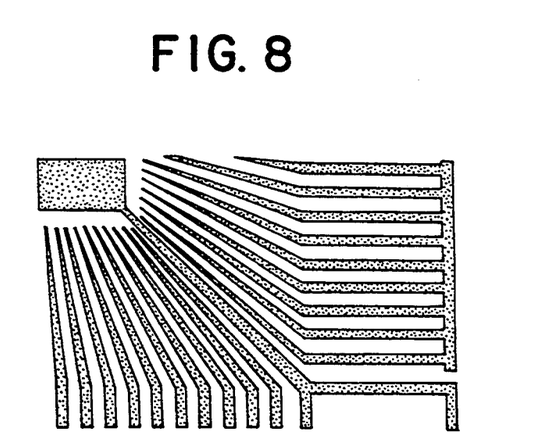
FIG. 8 is a schematic view showing part of a leadframe having no dam bar.

For the purpose of manufacturing a dam bar, the liquid adhesive obtained from Example 1 was used. A leadframe having no metallic dam bar as shown in FIG. 8 was used as a substrate, and a pattern was applied on the portion where the dam bar is originally placed. In order to somewhat remove the solvent of the resulting adhesive pattern, nitrogen heated at 150° C. was blown that the nylon-epoxy resin obtained from Comparative Example 2 was used, and the adhesive was thermally cured in an hot-air oven at 150° C. for 3 hours. Comparative Example 5

A conventional locking tape for a leadframe (produced by Tomoegawa Paper Co., LTD., ELEPHANE R-722) was used to tape a dam bar portion, and thermally cured in a hot air oven at 150° C. for 3 hours to obtain a leadframe equipped with a polyimide base film-provided dam bar.
(Evaluation)

The leadframes obtained from Examples 8 and 9 and Comparative Examples 4 and 5 were transfer-molded with an epoxy molding resin, and tested for the following items. The results are shown in Table 3.
 1. Shape of lead pin (state of bending)
 2. Protrusion from the portion between pins
 3. Protrusion from the portion other than between pins
 4. Stripping off from dam bar
 5. Shape of dam bar

TABLE 3

| | Shape of lead pin | Protrusion from the portion between pins | Protrusion from the portion other than between pins | Stripping off from dam bar | Shape of dam bar | Total evaluation |
|---|---|---|---|---|---|---|
| Ex. 8 | Good | None | None | None | Good | Good |
| Ex. 9 | Good | None | None | None | Good | Good |
| Comp. 4 | Slightly bad | Often observed | None | Often observed | Bad | Bad |
| Comp. 5 | Bad | Often observed | Yes | Observed | Bad | Bad |

As shown in Table 3, in the case of using the liquid adhesive of the present invention to form a resin-made dam bar by the dispensing or the screen printing method, better characteristics can be obtained than in the case where any other adhesive or the conventional adhesive tape for elecparts is us ed.

What is claimed is:

1. A liquid adhesive for electronic parts which comprises a dispersion obtained by dispersing the following component (b) in a solution of the following component (a) in an organic solvent, wherein the ratio of the component (b) to the component (a) is in a range of 10 to 900 parts by weight based on 100 parts by weight of component (a):

(a) a piperazinylethylaminocarbonyl-containing butadiene-acrylonitrile copolymer having a weight average molecular weight of 1,000–200,000, an acrylonitrile content of 5–50% by weight, and an amino equivalent of 500–10,000, represented by the following formula (I-1) or (I-2):

$$\text{(I-1)}$$

$$\text{HN}\underset{\phantom{X}}{\overset{\phantom{X}}{\diagup\diagdown}}\text{N}-(CH_2)_2-\overset{\overset{HO}{|}}{\underset{||}{N}}C-(CH_2-CH=CH-CH_2)_m-$$

$$-(CH_2-CH)_n-CN(CH_2)_2N\diagup\diagdown NH$$
$$\phantom{XXXXX}|\phantom{XXXXX}\overset{OH}{\underset{||}{|}}$$
$$\phantom{XXXXX}CN$$

$$\text{(I-2)}$$

$$-CH_2-CH=CH-CH_2)_k-(CH_2-CH)_m-(CH_2-CH)_n-$$
$$\phantom{XXXXXXXXXXXXX}|\phantom{XXX}|$$
$$\phantom{XXXXXXXXXXXXX}CN\phantom{X}O=C$$
$$\phantom{XXXXXXXXXXXXXXXXX}H-N(CH_2)_2N\diagup\diagdown NH$$

wherein, k, m, and n are molar ratios and taking n as 1, k is a number of 3–175, and m is a number of 0.3 to 93 in an organic solvent;

(b) a maleimide compound having at least two maleimide groups selected from the compounds represented by the following formulae (II-1) to (II-6):

(II-1) bismaleimide with bisphenol-A-type bridge (II-2) 4,4'-methylenediphenyl bismaleimide (II-3) 4,4'-methylenebis(3-ethyl-2-methylphenyl) bismaleimide (II-4) siloxane-bridged bismaleimide wherein P represents an integer of from 0 to 7

(II-5) phenoxy-methylsiloxane bismaleimide (II-6) multi-MI aromatic structure wherein $$MI = \begin{bmatrix} \overset{O}{\underset{||}{C}}\diagdown \\ \phantom{X}N-, \\ \underset{||}{\overset{C}{\diagup}} \\ O \end{bmatrix}$$

R = H or CH$_3$, and r = 1–15.

2. The liquid adhesive for electronic parts as claimed in claim 1, the organic solvent is at least one member selected from the group consisting of benzene, toluene, xylenes, 2-methoxyethanol, 2-ethoxyethanol, 2-butoxyethanol, chlorobenzene, trichloroethylene, and pyridine.

3. A process for forming an insulating layer in an electronic parts which comprise applying a liquid adhesive for electronic parts as claimed in claim 1 onto an electronic part by a dispensing or screen printing method, and thermally curing the adhesive to form an insulating pattern or an insulating layer.

* * * * *